United States Patent [19]

Miyake et al.

[11] 4,338,619
[45] Jul. 6, 1982

[54] FLIP-FLOP CIRCUIT

[75] Inventors: Masayuki Miyake; Takeo Sekino; Masashi Takeda; Yasuharu Baba, all of Tokyo, Japan

[73] Assignee: Sony Corporation, Tokyo, Japan

[21] Appl. No.: 156,207

[22] Filed: Jun. 3, 1980

[30] Foreign Application Priority Data

Jun. 8, 1979 [JP] Japan .................................. 54-72520

[51] Int. Cl.³ .................... H01L 27/04; H03K 19/091
[52] U.S. Cl. .................................... 357/46; 307/459; 307/289; 357/20; 357/92
[58] Field of Search ............................ 357/92, 46, 20; 307/213, 477, 459

[56] References Cited

PUBLICATIONS

Tucci et al., IEEE J of Solid State Circuits, vol. SC 11, No. 6, Dec. 1976, pp. 847–851.

Kerns, Jr., IEEE J. of Solid State Circuits, vol. SC 11, No. 5, Oct. 1976, pp. 712–717.

Ilzuka, IEEE J of Solid State Circuits, vol. SC 12, No. 5, Oct. 1977, pp. 530–532.

Primary Examiner—William D. Larkins
Attorney, Agent, or Firm—Hill, Van Santen, Steadman, Chiara & Simpson

[57] ABSTRACT

A flip-flop circuit is disclosed which has a first semiconductor region of a first conductivity type, injector and base regions of a second conductivity type in the first region, and collector region of the first conductivity type in the base region. In this case, the first, base and collector regions constitute a gate transistor, two of the gate transistors constitute a flip-flop circuit, and each of the transistors has a predetermined distance relation among the injector and collector regions and base contacts in such a manner that the inherent difference of ON and OFF speeds between the transistors causes the flip-flop circuit to operate without causing unnecessary delay.

6 Claims, 20 Drawing Figures

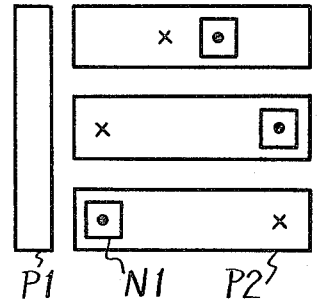

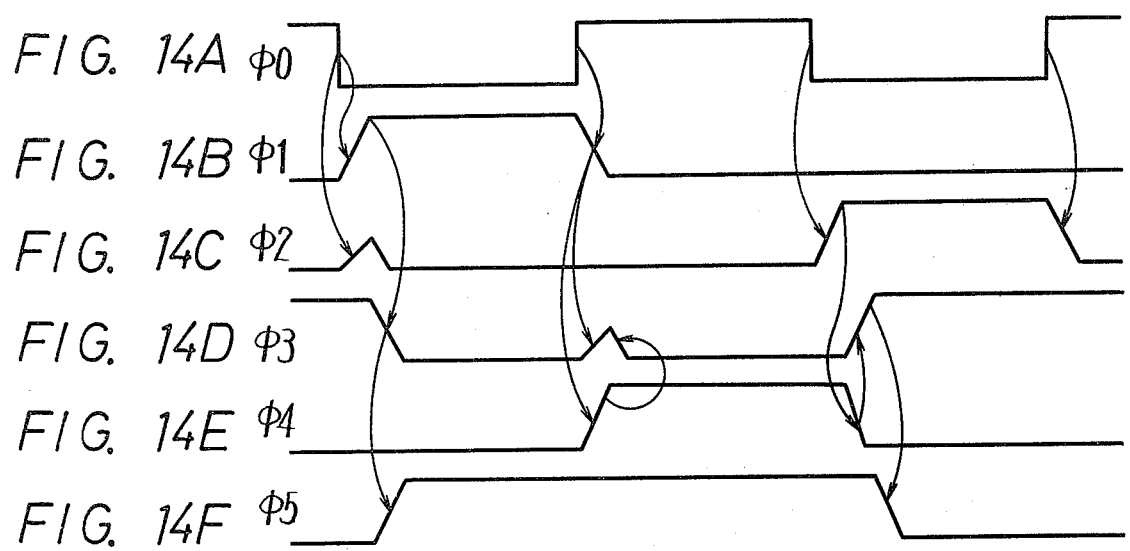
FIG. 14A φ0
FIG. 14B φ1
FIG. 14C φ2
FIG. 14D φ3
FIG. 14E φ4
FIG. 14F φ5
FIG. 15
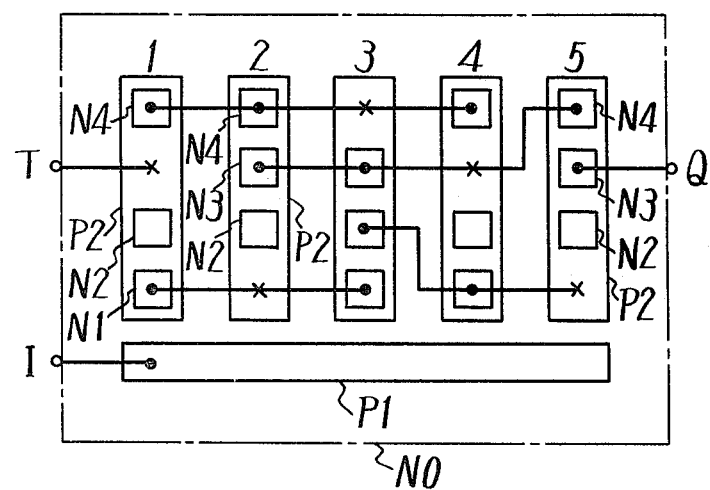

4,338,619

FLIP-FLOP CIRCUIT

BACKGROUND OF THE INVENTION

1. Field of the Invention

The present invention relates generally to a flip-flop circuit, and is directed more particularly to a flip-flop circuit formed of an IIL (integrated injection logic) or MTL (merged transistor logic).

2. Description of the Prior Art

A prior art IIL is fundamentally formed as shown in FIG. 1. In FIG. 1, N0 designates, for example, an N-conductivity type semiconductor substrate, P1 and P2 P-conductivity type regions, which are respectively formed on one of the major surfaces of substrate N0, and N1 to N3 N-conductivity type regions which are respectively formed in the region P2. Electrodes (terminals) I, B and C1 to C3 are connected to the regions P1, P2 and N1 to N3, respectively.

In the IIL shown in FIG. 1, the region P1-substrate N0-region P2 form a PNP-type transistor Q1 as shown in FIG. 2, and the substrate N0-region P2-regions N1 to N3 form an NPN-type transistor Q2 of a multi-collector type as shown in FIG. 2. In this case, the transistors Q1 and Q2 are connected with each other as shown in FIG. 2.

With the IIL shown in FIG. 1 or FIG. 2, when a voltage $+V_{EE}$ is applied to the electrode I, the transistor Q1 operates as a constant current bias source. Therefore, the transistor Q2 operates as an inverter of an open-collector type. Further, when the voltage $+V_{EE}$ applied to the electrode I is made ON and OFF, the transistor Q2 operates as a gate.

In the following description, the IIL described above will be symbolized as shown in FIG. 3 for the sake of brevity.

In the case where the above IILs are used to form a T-flip-flop circuit in the prior art, it is sufficient that, as shown in FIG. 4, IILs 2 to 7 are connected to make three sets of latch circuits (RS-flip-flop circuits) and an input IIL 1 is connected to the latch circuits. In FIG. 4, T designates an input terminal and Q an output terminal, respectively. In FIG. 4, though not shown, an output terminal $\overline{Q}$ is led out from the IIL 7.

The above prior art T-flip-flop circuit may be made as an IC (integrated circuit) chip, for example, as shown in FIG. 5 which is a plan view of the IC chip. As shown in FIG. 5 which is a plan view of the IC chip, the injector region P1 is formed on the semiconductor substrate N0 in the form of a straight line or band, and the regions P2 of respective IILs 1 to 7 are formed on the substrate N0 which are extended, each in the form of a straight line or band in the direction perpendicular to the common straight line region P1 and arranged along the extending direction of region P1 with a distance between adjacent ones respectively. In each of regions P2 of IILs 1 to 7, provided are some of collector regions N1 to N3. Then, the respective regions P1, P2 and N1 to N3 are connected to form a wiring pattern (shown by the thick lines in FIG. 5) in correspondence with the wiring pattern of FIG. 4. In FIG. 5, the marks · designate the ohmic contact points of the wiring pattern with the regions N1 to N3 (and P1), and the marks X designate the ohmic contact points of the wiring pattern with the regions P2 (in other words, the marks · represent the collector electrodes of transistors Q2 and the marks X the base electrodes of transistors Q2, respectively).

In the above IC chip, since the single region P1 operates as the common injector region to the IILs 1 to 7, the IILs 1 to 7 operate separately and hence, as a whole, perform the operation of the T-flip-flop circuit.

As may be clear from FIGS. 4 and 5, the number of the IILs forming the T-flip-flop circuit is large and the area occupied by the wiring pattern is also large, so that the IC chip has the disadvantage that it does not have high density and high speed.

To avoid this disadvantage, such a T-flip-flop circuit, in which delay devices 11 and 12 are provided so as to reduce the number of the IILs as shown in FIG. 6, may be considered. In this case, the delay devices 11 and 12 are used to increase the areas of the corresponding IILs 2 and 5 to increase the capacity thereof as shown in FIG. 7, and to shorten, for example, the injector length (the facing length between the injector region P1 and the regions P2 of IILs 2 and 5) so as to reduce the injection current.

The T-flip-flop circuit shown in FIGS. 6 and 7 has a smaller number of the IILs and a smaller area occupied by the wiring pattern, so that it can be made to have high density. With the circuit of FIGS. 6 and 7, the operating speed as a T-flip-flop circuit is limited by the delay devices 11 and 12, and hence lower than the inherent operating speed of the IIL so that the high speed operation cannot be obtained from the circuit.

Further, with the circuit of FIGS. 6 and 7, if the injection current is selected to be small due to the delay devices 11 and 12, it becomes unbalanced with the injection currents of the other IILs and hence the severe characteristics of the elements are required in view of the DC operation, which is not desired.

OBJECTS AND SUMMARY OF THE INVENTION

Accordingly, an object of the present invention is to provide a novel flip-flop circuit free of the disadvantage inherent to the prior art.

Another object of the invention is to provide a flip-flop circuit which utilizes the characteristics of an IIL to make the operation speed high.

A further object of the invention is to provide a T-flip-flop circuit which can be made high in density and operable at high speed by suitably selecting the distance and positions of an injector region, collector region and base electrode of IILs to give them a time difference when they are operating.

According to an aspect of the present invention, a flip-flop circuit is provided which comprises:

a first semiconductor region of a first conductivity type;

injector and base regions of a second conductivity type in said first region; and collector regions of the first conductivity type in said base region;

said first, base and collector regions constituting a gate transistor;

two of said gate transistors constituting a flip-flop, and each of said transistors having a predetermined distance relation among said injector and collector regions and base contacts in such a manner like that the inherent difference of ON and OFF speeds between said transistors renders said flip-flop to operate without causing unnecessary delay.

The other objects, features and advantages of the present invention will be apparent from the following description taken in conjunction with the accompanying drawings through which the like references designate the same elements and parts.

BRIEF DESCRIPTION OF THE DRAWINGS

FIGS. 8 to 11 are tables respectively showing the results of experiments;

FIGS. 14A to 14F are waveform diagrams respectively showing signals appearing at the respective points of the example shown in FIG. 13; and FIG. 15 is a top plan view showing an other example of the invention.

DESCRIPTION OF THE PREFERRED EMBODIMENT

Before describing the present invention the experiments and the results thereof, which were carried out on an IIL, by the inventors of the present invention, will be described.

In the table shown in FIG. 8, the left column represents the distance between the collector region N1 of transistor Q2 and the contact point (base electrode) of the base wiring pattern marked with X, and the right column represents the speed of transistor Q2 being changed from ON to OFF. If the above distance is varied and then the ON and OFF speed becomes measured, the speed is high as the distance is shortened as shown in the right column of the table in FIG. 8. This is also true in case the positional relation between the collector region N1 to the injector region P1 and the base electrode X are reversed. Relatively, the ON and OFF speed becomes higher as the distance becomes shorter.

FIG. 9 is a table in which the left column shows the distance between the injector region P1 and the collector region N1 of transistor Q2, and the right column shows the speed of transistor Q2 being changed from ON to OFF. When the speed is measured with distance being a variable, the speed becomes higher as the distance becomes longer as shown in the table of FIG. 9. The above tendency is always established regardless of the position of the base electrode X.

FIG. 10 is a table in which the left column shows the distance between the injector region P1 and the collector region N1 of transistor Q2, and the right column shows the speed of transistor Q2 being changed from OFF to ON. When the speed is measured with distance being a variable, the speed becomes higher as the distance becomes shorter as shown in the table of FIG. 10. In this case, the above tendency is always established regardless of the position of the base electrode X.

Figure 11:
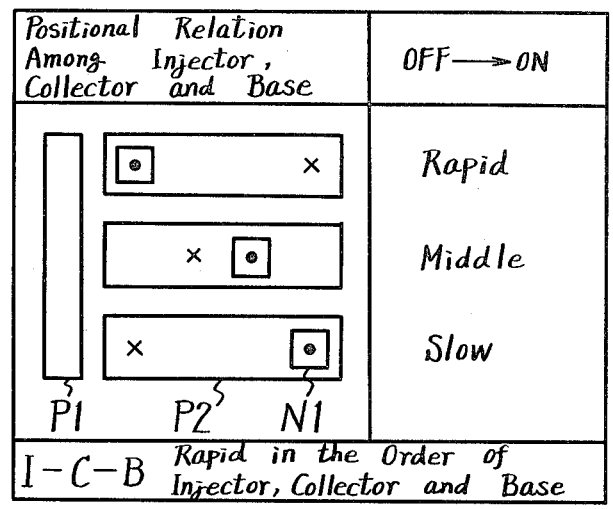

FIG. 11 is a table in which the left column shows the positional relation among the injection region P1, the collector region N1 and the base electrode X, and the right column is the speed of transistor Q2 being changed from OFF to ON. When the speed is measured, the speed is highest when the positional relation is the injector region P1 then the collector region N1 then the base electrode X.

These phenomena may be caused by the fact that, due to the DC resistance and parasitic capacitance of the region P2, time delay is generated in the variation of the effective base potential and that the substantial current amplification factor of transistor Q2 is lowered by the DC resistance.

Now, the present invention will be described with reference to FIG. 12 and the following.

Figure 12:
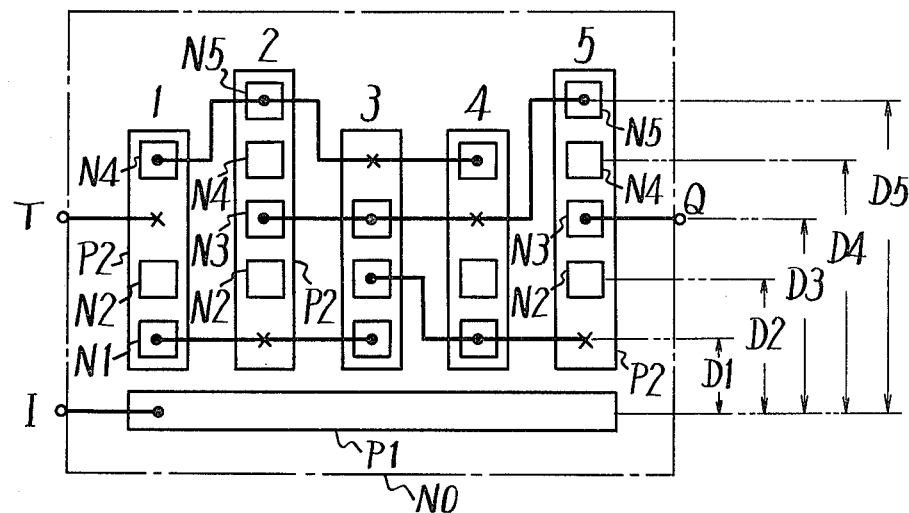
FIG. 12 is a top plan view of an example of the flip-flop circuit according to the present invention formed as an IC chip.

FIG. 12 shows an example of the T-flip-flop circuit according to the present invention which is high in density and also in operating speed. In the example of FIG. 12, an injector region P1 and regions P2, which will become IILs 1 to 5 respectively, are formed in a semiconductor substrate N0 in faced relation with one another. In this case, if the distances from the region P1 to certain positions of the regions P2 along their lengthwise direction be taken as D1, D2, D3, D4 and D5, the distances D1 to D5 are selected to satisfy the condition $D1 < D2 < D3 < D4 < D5$. In this case, collector regions N1, N2 and N4 are respectively formed in each of the regions P2, which will become IILs 1 and 4, at the positions of distances D1, D2, and D4; collector regions N2, N3, N4 and N5 are respectively formed in each of the regions P2, which will become IIL 2 and 5, at the positions of distances D2, D3, D4, and D5; and collector regions N1, N2 and N3 are respectively formed in the regions P2, which will become an IIL 3, at the positions of distances D1, D2 and D3.

Further, in the example of FIG. 12, the wiring pattern so provided through the respective regions P2 that the portions of regions P2, which become IILs 1 and 4, at the positions corresponding to the distance D3 become the base electrodes; the portions of regions P2, which become IILs 2 and 5, at the positions corresponding to the distance D1 become the base electrodes; and the portion of region P2, which becomes IIL 3, at the position corresponding to the distance D4 becomes the base electrode, respectively.

Figure 13:
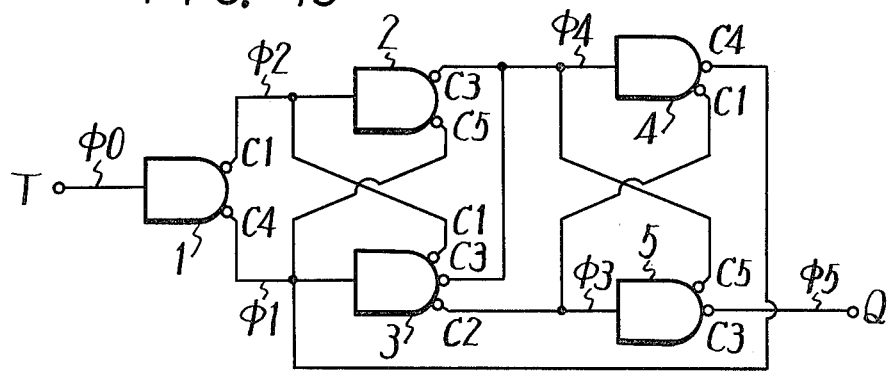
FIG. 13 is a connection diagram of the example shown in FIG. 12.

FIG. 13 shows an equivalent circuit of the IC chip shown in FIG. 12. The operating speeds of this IC chip circuit are as follows:

i. Since the collector region N4 of IIL 1 is spaced apart from the injector region P1 and near the base electrode X, the collector C4 of IIL 1 becomes OFF faster than the collector C1 thereof.

ii. Since the collector region N1 of IIL 3 is near the injector region P1 and within the inside of its base electrode X and since the collector region N5 of IIL 2 is in the reverse relation to that of IIL 3, the collector C1 of IIL 3 comes ON faster than the collector C5 of IIL 2.

iii. Since the collector region N3 of IIL 3 is spaced apart from the injector region P1 and near the base electrode X, the collector C3 of IIL 3 comes OFF faster than its collector C2.

iv. Since the collector region N1 of IIL 4 is near the injector region P1 and within the inside of the base electrode X, the collector C1 of IIL 4 comes ON faster than the collector C5 of IIL 5.

FIGS. 14A through 14F show the waveforms of signals $\phi 0$ through $\phi 5$ appearing at the respective electrodes of the example shown in FIG. 13, so that the IC chip circuit shown in FIG. 12 or 13 operates as a T-flip-flop circuit.

Figure 6:
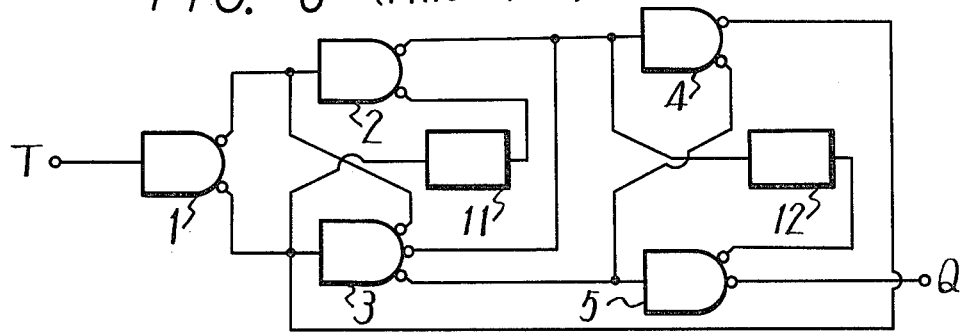
Figure 7:
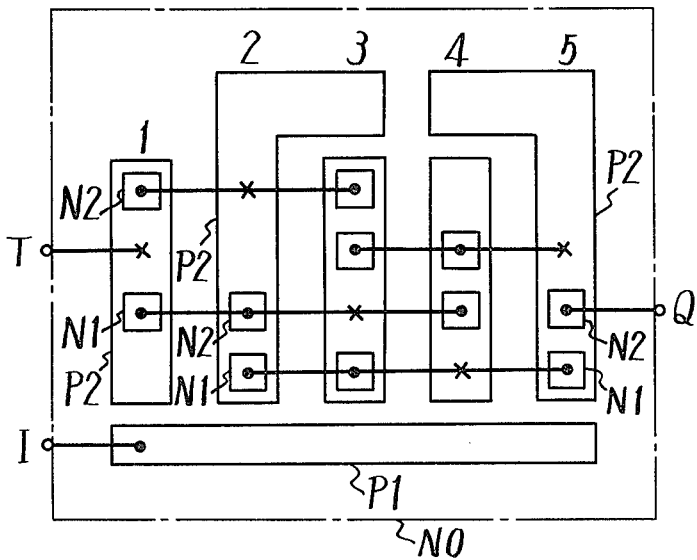

According to the example of the invention shown in FIG. 12 or 13, the T-flip-flop circuit is made of five IILs 1 to 5 of the gate, so that the area of the semiconductor substrate NO, on which the IILs 1 to 5 are formed, can be reduced by $\frac{1}{2}$ to $\frac{2}{3}$ as compared with that of the prior art and hence high density can be obtained in the IC chip. In this case, since the example of the invention requires no delay devices 11 and 12, which are required in the prior art example shown in FIG. 6, and only the inherent time characteristics of the IIL is utilized, the circuit of the invention will have a high operating speed. In this case it is possible to give much freedom for the wiring pattern.

Figure 1:
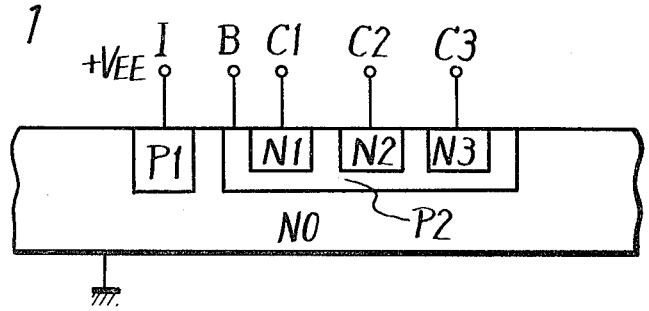
FIG. 1 is a cross-sectional view showing a prior art IIL.
Figure 2:
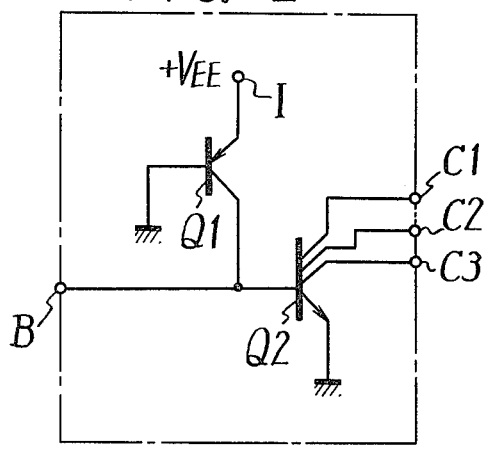
FIG. 2 is an equivalent circuit of the IIL shown in FIG. 1.
Figure 3:
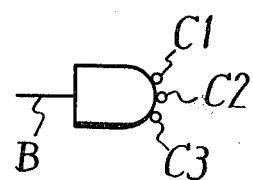
FIG. 3 is a diagram showing the symbol of the IIL.
Figure 4:
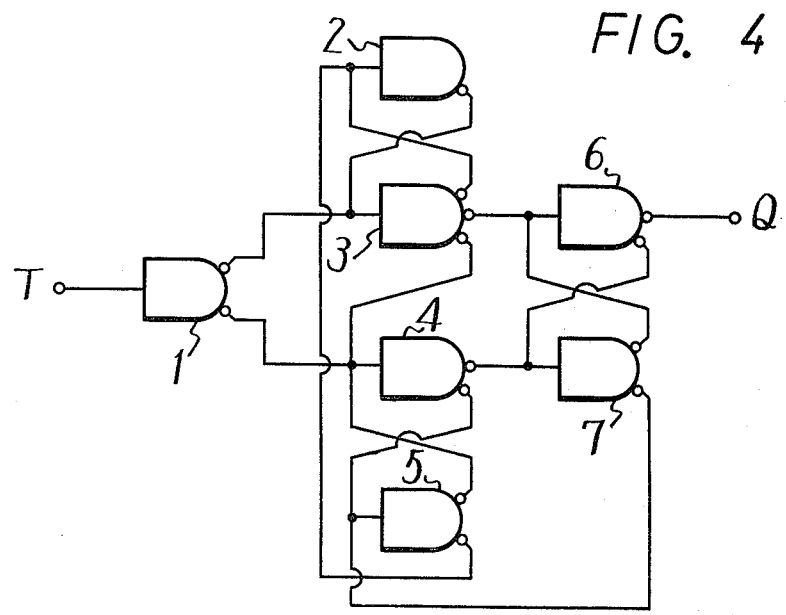
FIGS. 4 and 6 are respectively connection diagrams of prior art flip-flop circuits using the IILs.
Figure 5:
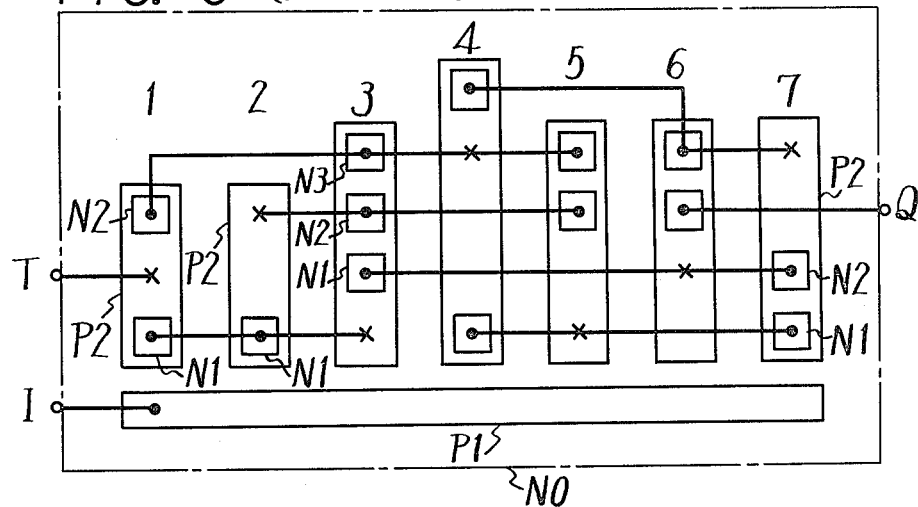
FIGS. 5 and 7 are respectively top plan views of the flip-flop circuit shown in FIGS. 4 and 6 formed as IC chips.

In the prior art circuit shown in FIG. 4, in order to reset the circuit, it is necessary to supply reset signals to the IILs 3, 5 and 7, respectively, which requires a complicated wiring pattern on the IC chip and hence prevents high density IC chips and complicates the wiring pattern. On the contrary, according to the present invention, it is sufficient to simply supply the reset signal to only the IIL 5 for the same purpose, so that the IC chip can be made high in density and more flexibility for the wiring pattern exits.

Further, since in this invention the initial states of IILs 1 to 5 are determined, it is needless to apply the initial reset to the circuit when the power is supplied to the circuit, which means that the circuit of the prior art required for this purpose is unnecessary.

FIG. 15 shows another example of the invention whose operation speed is faster than that of the former example of the invention.

In the above examples of the invention, it is possible to omit the collector regions to which the wiring pattern is not connected.

Further, the idea of the present invention can be applied to a D-flip-flop circuit with substantially the same results.

It will be apparent that many modifications and variations could be effected by one skilled in the art without departing from the spirits or scope of the novel concepts of the present invention, so that the spirits or scope of the invention should be determined by the appended claims only.

We claim as our invention:

1. A T flip-flop circuit comprising, a substrate of semiconductor material of a first conductivity type, a first generally rectangularly-shaped region of a second conductivity type formed in said substrate, second through sixth generally rectangularly-shaped regions of a second conductivity type formed parallel to each other in said substrate and the longitudinal axes of said second through sixth rectangularly-shaped regions extending normal to the longitudinal axis of said first rectangularly-shaped region, a plurality of collector regions of first conductivity type formed in said second through sixth rectangularly-shaped regions, first ones of said plurality of collector regions formed in said second, fourth and fifth rectangularly-shaped regions and spaced a distance $D_1$ from said first rectangularly-shaped region, a second one of said plurality of collector regions formed in said fourth rectangularly-shaped region and spaced a distance of $D_2$ from said first rectangularly-shaped region, third ones of said plurality of collector regions formed in said third, fourth and sixth rectangularly-shaped regions and spaced a distance $D_3$ from said first rectangularly-shaped region, fourth ones of said plurality of collector regions formed in said second and fifth rectangularly-shaped regions and s-paced a distance $D_4$ from said first rectangularly-shaped region, fifth ones of said plurality of collector regions formed in said third and sixth rectangularly-shaped regions and spaced a distance $D_5$ from said first rectangularly-shaped region and $D_1 < D_2 < D_3 < D_4 < D_5$, a plurality of base regions located in said second through sixth rectangularly-shaped regions with the base regions in the second and fifth rectangularly-shaped regions located at a distance of $D_3$, the base regions in the third and sixth rectangularly-shaped regions located at a distance $D_1$, the base region in the fourth rectangularly-shaped region located at distance $D_4$, the base region in said fifth rectangular region located at a distance $D_3$, and said base region in said third rectangularly-shaped region electrically connected to said first ones of said plurality of collector regions in said second and fourth rectangularly-shaped regions, said base region in said fourth rectangularly-shaped region electrically connected to the fourth ones of said plurality of collector regions in said second and fifth rectangularly-shaped regions and to said fifth one of said collector region in said third rectangularly-shaped region, said base region in said fifth rectangularly-shaped region electrically connected to said third ones of said plurality of collector regions in said third and fourth rectangularly-shaped region, and to the fifth one of said collector region in said sixth rectangularly-shaped region, said base region in said sixth rectangularly-shaped region electrically connected to said first collector region in said fifth rectangularly-shaped region and to said second collector region in said fourth rectangularly-shaped region.

2. A T flip-flop circuit according to claim 1 including an input lead connected to the base region in said second rectangularly-shaped region.

3. A T flip-flop circuit according to claim 2 including an output lead connected to said third collector region in said sixth rectangularly-shaped region.

4. A T flip-flop circuit comprising, a substrate of semiconductor material of a first conductivity type, a first generally rectangularly-shaped region of a second conductivity type formed in said substrate, second through sixth generally rectangularly-shaped regions of a second conductivity type formed parallel to each other in said substrate and the longitudinal axes of said second through sixth rectangularly-shaped regions extending normal to the longitudinal axis of said first rectangularly-shaped region, a plurality of coll-ctor regions of first conductivity type formed in said second through sixth rectangularly-shaped regions, first ones of said plurality of collector regions formed in said second, fourth and fifth rectangularly-shaped regions and spaced a distance $D_1$ from said first rectangularly-shaped region, a second one of said plurality of collector regions formed in said fourth rectangularly-shaped region and spaced a distance of $D_2$ from said first rectangularly-shaped region, third ones of said plurality of collector regions formed in said third, fourth and sixth rectangularly-shaped regions and spaced a distance $D_3$ from said first rectangularly-shaped region, fourth ones of said plurality of collector regions formed in said second, third, fifth and sixth rectangularly-shaped regions and spaced a distance $D_4$ from said first rectangularly-shaped region, and $D_1$ $D_2$ $D_3$ $D_4$, a plurality of base regions located in said second through sixth rectangularly-shaped regions with the base regions in the second and fifth rectangularly-shaped regions located at a distance of $D_3$, the base regions in the third and sixth rectangularly-shaped regions located at a distance $D_1$, the base region in the fourth rectangularly-shaped region located at distance $D_4$, and said base region in said third rectangularly-shaped region electrically connected to said first collector regions in said second and third rectangularly-shaped regions, said base region in said fourth rectangularly-shaped region electrically connected to said fourth collector regions in said second, third and fifth rectangularly-shaped regions, said base region in said fifth rectangularly-shaped region electrically connected to the third collector regions in said third and fourth rectangularly-shaped regions and to the fourth collector region in said sixth rectangularly-shaped region, and the base region in said sixth rectangularly-shaped region electrically connected to said second collector region in said fourth rectangularly-shaped region and the first collector region in said fifth rectangularly-shaped region.

5. A T flip-flop circuit according to claim 4 including an input lead connected to the base region in said second rectangularly-shaped region.

6. A T flip-flop circuit according to claim 5 including an output lead connected to the third collector region in said sixth rectangularly-shaped region.

* * * * *